United States Patent [19]
Daly

[11] Patent Number: 6,102,742
[45] Date of Patent: Aug. 15, 2000

[54] ELECTRICAL CONNECTOR HAVING VARIABLE RESISTANCE CONTACTS

[75] Inventor: John Daly, Chicago, Ill.

[73] Assignee: Methode Electronics, Inc., Chicago, Ill.

[21] Appl. No.: 09/107,873

[22] Filed: Jun. 30, 1998

[51] Int. Cl.[7] .................................................. H01R 13/66
[52] U.S. Cl. ............................ 439/620; 439/951; 338/21
[58] Field of Search ................................... 439/620, 181, 439/951, 887; 338/21, 220

[56] References Cited

U.S. PATENT DOCUMENTS

| | | | |
|---|---|---|---|
| 3,750,082 | 7/1973 | Petersen et al. | 338/220 |
| 4,747,783 | 5/1988 | Bellamy et al. | 439/181 |
| 4,925,407 | 5/1990 | Hauser et al. | 439/886 |
| 5,340,641 | 8/1994 | Xu | 338/21 |
| 5,478,253 | 12/1995 | Biechler et al. | 439/181 |
| 5,688,146 | 11/1997 | McGinley et al. | 439/637 |
| 5,742,223 | 4/1998 | Simendinger, III et al. | 338/21 |

OTHER PUBLICATIONS

AMP (Dual Conductivity Contact) dated May 8, 1998.
ENDL Letter dated Mar. 1998 Happenings (pp. 21–27).

*Primary Examiner*—Gary F. Paumen
*Assistant Examiner*—Katrina Davis
*Attorney, Agent, or Firm*—David L. Newman

[57] ABSTRACT

A ribbon style electrical connector is provided having at least one variable resistance contact such that an electrical resistance between the variable resistance contact and a corresponding mating contact of a second mating connector varies from a relatively high resistance to a relatively low resistance as the first and second connectors transition from an unmated to a mated position. The ribbon style connector includes a housing having a first end and a second end, with a shroud depending from the first end, the shroud defining a contact chamber. A substrate is mounted within the contact chamber and communicates with the second end of the housing. A plurality of signal contacts are adhered to a surface of the substrate, with at least one of the signal contacts including a resistive portion and a conductive portion. The resistive portion and conductive portions being arranged such that a mating contact of the second connector will engage the resistive portion first and engagedly moves along the resistive portion toward the conductive portion as the ribbon style connector and the second connector are intermated. When the two connectors are fully mated, the mating contact directly engages the conductive portion of the resistive contact.

22 Claims, 6 Drawing Sheets

ELECTRICAL CONNECTOR HAVING VARIABLE RESISTANCE CONTACTS

BACKGROUND OF THE INVENTION

The present invention relates to electrical connectors for use in data communication applications where it is desirable to connect peripheral devices to a data communications bus without removing power from the bus. The present invention provides an electrical connector having variable resistance contacts such that as a first connector associated with the peripheral device and a second connector associated with the bus are mated, the resistance across the mating contacts of the two connectors varies from a relatively high resistance at the point of initial contact, to a relatively low resistance approaching 0 Ω, when the connectors are fully mated.

In many computer systems, it is desirable to connect peripheral devices such as disc drives or other devices to a parallel data bus such as a Small Computer System Interface (SCSI) bus. In most older computer systems it is necessary to remove power from the bus while connecting a new peripheral device. For convenience, however, newer systems allow peripheral devices to be connected to the bus while the host system remains under power. Devices which may be connected directly to an energized bus are often referred to as "hot pluggable", and the act of connecting such a device to an active bus is known as "hot plugging". While the benefits of connecting a device directly to an energized bus without removing power are clear, hot plugging has a tendency to adversely effect data signals already present on the bus.

Generally, hot plugging is accomplished via a pair of mating connectors, each having a plurality of complimentary signal contacts. The first connector is associated with the peripheral device and mates with the second connector which is attached to the bus. Individual contacts within the connectors are attached to the various signal lines of the bus, including power, ground, and data signals. Problems arise in the first few nanoseconds as the two connectors make contact and the de-energized circuits of the hot plugging peripheral device are electrically connected to the energized circuits of the bus. As the individual signal contacts of the two connectors physically engage one another, the voltage charged on the various signal lines of the bus is pulled down as the uncharged capacitance of the peripheral device's circuits is charged. This causes a slight dip in the bus signal line voltage which can be interpreted as a data error on the signal line. Thus, data errors, or glitches, can be created when an additional peripheral device is hot plugged onto the bus.

Recently it has been determined that the problem of glitches caused by hot plugging can be ameliorated by providing a staged resistance associated with the contacts of either the peripheral connector or the bus connector. Using this approach, as the two connectors mate, the individual mating contacts initially create a high resistance path between the bus and the uncharged circuits of the hot plugging peripheral device. However, as the two connectors are moved closer to a fully mated position, the individual signal contacts move from this first high resistance stage to a second, lower resistance stage. This process of moving to progressively lower, staged resistances may be continued through any number of different resistance levels until the connectors are fully mated. In practice, 3 to 5 resistance stages have been preferred. When the contacts are fully mated, an exclusively metal to metal connection is formed such that the resistance across the connector becomes negligible.

Implementing such staged resistance contacts within a practical, commercial connector, however, as proven difficult. The foremost difficulty has been to provide a connector with variable resistance contacts in a compact package suitable for commercial use. Further, it has been difficult to produce such a connector at a reasonable cost. Thus, there exists a need for an electrical connector which presents a progressively diminishing resistance across the connector contacts as the connector transitions from an unmated to a mated position. It is desirable that such a connector should be inexpensive to produce, and capable of being conveniently packaged in a relatively compact housing.

SUMMARY OF THE INVENTION

In light of the prior art as described above, one of the main objectives of the present invention is to provide an electrical connector which allows peripheral electronic devices to be connected to a data communications bus without removing power to the bus.

A further object of the present invention is to provide an electrical connector providing hot plugging of peripheral devices to a communications bus without causing data errors on the bus during the hot plugging operation.

Another objective of the present invention is to provide an electrical connector which includes progressive resistance contacts such that as the connector is mated with a cooperating connector, the electrical resistance across the mating contacts of the two connectors diminishes as the connectors moves from an unmated to a mated position.

Still another objective of the present invention is to provide an electrical connector including progressively diminishing resistance contacts wherein the resistance across the contacts drops in a linear manner from an initial relatively high contact resistance to approximately 0 Ω as the connector moves from an unmated to a mated position.

Yet another objective of the present invention is to provide an inexpensive electrical connector having progressive resistance contacts.

An additional objective of the present invention is to provide an electrical connector having progressive resistance contacts in a convenient compact package.

A further objective of the present invention is to provide a ribbon style electrical connector having progressive resistance contacts.

A still further objective of the present invention is to provide a ribbon style electrical connector having progressive resistance contacts wherein the contacts are formed having a 0.8 mm pitch.

Another objective of the present invention is to provide an electrical connector having progressive resistance contacts wherein the initial resistance between mating contacts is equal to approximately 500 Ω and is reduced to approximately 0 Ω when the connector is fully mated.

All of these objectives, as well as others that will become apparent upon reading the detailed description of the presently preferred embodiment of the invention, are met by the Electrical Connector Having Variable Resistance Contacts herein disclosed.

The present invention relates generally to an electrical connector specially adapted to allow peripheral electronic components to be connected to an active data communications bus without requiring power to be removed from the bus prior to connecting the peripheral component. The connector of the present invention facilitates so called "hot plugging" by incorporating a progressive resistance within at least one contact element of the connector. Hot plugging requires two intermatable connectors, a first connector associated with the peripheral device, and a second connected to the bus. The progressive resistance contact may be provided on either the peripheral device connector, or the bus connector. Further, the progressive resistance is configured such that as the contact of the first connector makes initial contact with the corresponding mating contact of the second connector, the resistance across the two contacts is relatively large. As the two connectors are moved closer to a fully mated position, the resistance across the contacts progressively diminishes until, when the connectors are fully mated, the resistance across the contacts drops to approximately 0.

In a preferred embodiment, the resistive contact is formed on the surface of a supporting substrate mounted within a first connector. The contact includes a front resistive portion formed nearest the edge of the substrate, and a conductive portion formed in line with the resistive portion and located toward the rear of the contact. At a short middle section of the contact, the resistive portion overlaps the conductive portion. A mating contact is mounted in a second connector and configured to engage the progressive resistance contact of the first connector. The mating contact engages the progressive resistance contact with a wiping action such that the mating contact first engages the progressive resistance contact near the edge of the substrate at the very end of the resistive portion of the contact. Then, as the two connectors are further inserted toward the fully mated position, the mating contact slides along the surface of the resistive portion toward the conductive portion, until, in the fully mated position, the mating contact engages the conductive portion of the resistive contact only.

Again, in a preferred embodiment of the invention, the "hot plugging" connector comprises a ribbon style electrical connector. The male ribbon style connector includes a plurality of resistive contacts formed on the male contact element, or substrate, mounted within the connector. This embodiment may further include a printed circuit board protruding through the male connector housing and shroud with the edge of the printed circuit board serving as the contact support substrate. It is further contemplated that the resistive portion of the resistive contacts is formed of a polymer thick film resistor screened onto the surface of the printed circuit board. The resistive portion may include a single polymer thick film resistor having a uniform resistance along the length thereof, or the resistive portion may include multiple layers of polymer thick film resistors with each layer having a unique resistance and a varied length such that the total resistance of the resistive portion changes along the length thereof.

In this manner, a ribbon style electrical connector is provided having a variable resistance contact such that an electrical resistance between the variable resistance contact and a corresponding mating contact of a second mating connector varies from a relatively high resistance to a relatively low resistance as the first and second connectors transition from an unmated to a mated position. The ribbon style connector includes a housing having first and second ends. A shroud depends from the first end and defines a contact chamber. Within the contact chamber, a substrate is mounted to the housing, the substrate extending through the housing, and communicating with the second end. A plurality of signal contacts are adhered to the surface of the substrate, at least one of which includes a resistive portion arranged such that a mating contact of the second connector engages the resistive portion first and engagedly moves along the resistive portion towards the conductive portion as the first and second connectors are intermated. Finally, when the two connectors are fully intermated, the mating contact fully engages the conductive portion of the contact only.

DETAILED DESCRIPTION OF THE PRESENTLY PREFERRED EMBODIMENTS

The present invention relates to an improved electrical connector for connecting a peripheral computer device to an active communication bus. The present invention allows the peripheral device to be connected to the bus without removing power to the bus prior to making the connection. Such "hot-plugging" is accomplished without data errors, or "glitches" being created on the bus due to a voltage drop on the signal lines as the signal line voltage is diverted to charring the uncharged capacitance of the peripheral device circuits. The voltage drop on the signal lines is prevented by a transitional resistance placed in series with the mating contacts of each half of the connector.

Figure 1:
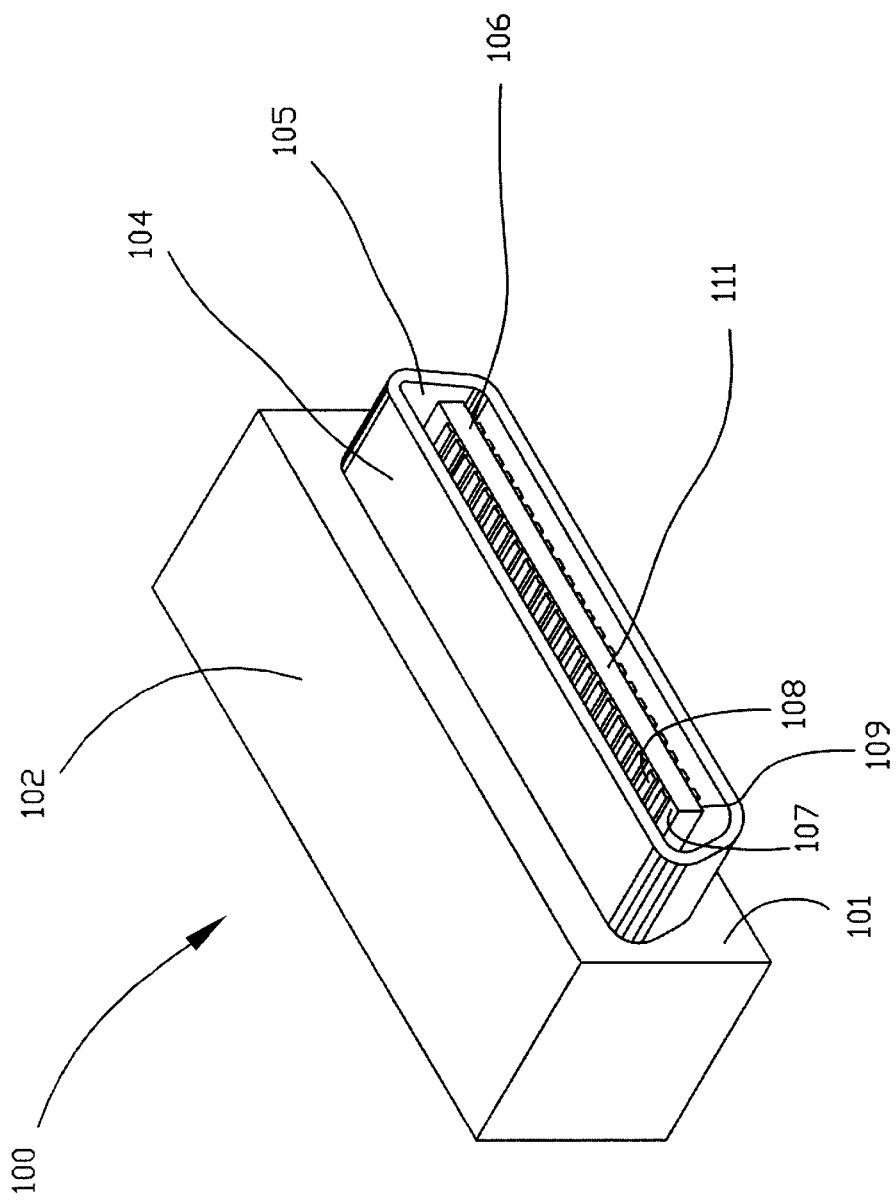
FIG. 1 is an isometric view of a male ribbon style connector according to the preferred embodiment of the present invention.
Figure 2:
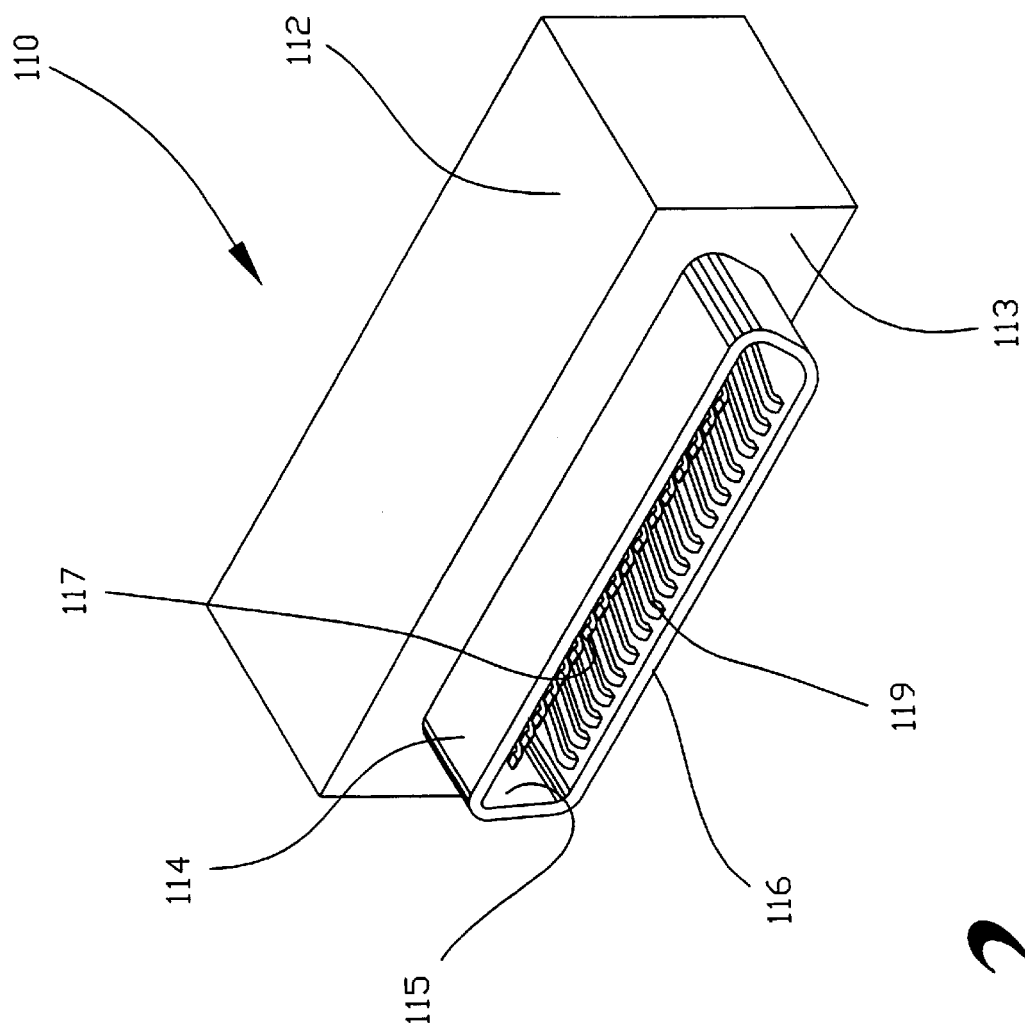
FIG. 2 is an isometric view of a female ribbon style connector according to the preferred embodiment of the present invention.

Turning to FIGS. 1 and 2, male and female ribbon style connectors 100, 110 according to the preferred embodiment of the invention are shown in isometric view. In FIG. 1 male ribbon style connector 100 includes a housing 102 and a shroud 104 extending from a front surface 101 of the housing. Shroud 104 further defines a contact cavity 105. In the preferred embodiment, shroud 104 is formed as a D-shell to ensure proper polarization of the multiple signal contacts mounted therein. While the D-shell disclosed in FIG. 1 is preferred, it should be clear to those skilled in the art that other keying arrangements may be employed to ensure proper alignment of the various signal contacts within the connector. An insulated substrate 106 protrudes from housing 102 into contact cavity 105. Finally, a plurality of contact elements 108 are formed along the leading edge 111 of substrate 106, on the upper and lower surfaces 107, 109 thereof. As will be discussed in greater detail below, at least one of the contacts 108 is a diminishing resistance contact in that the resistance of the contact is reduced in a continuous manner along at least a partial length of the contact.

A female ribbon style connector 110 configured to mate with male connector 100 is shown in isometric view in FIG. 2. Female connector 110 includes a housing 112 and a shroud 114 extending from a front surface 113 of the housing. Shroud 114 is also formed as a D-shell, only smaller than the D-shell shroud 104 of male connector 100, such that shroud 114 is insertable into contact cavity 105 of connector 100. Shroud 114 also defines a contact cavity 115.

Figure 4:
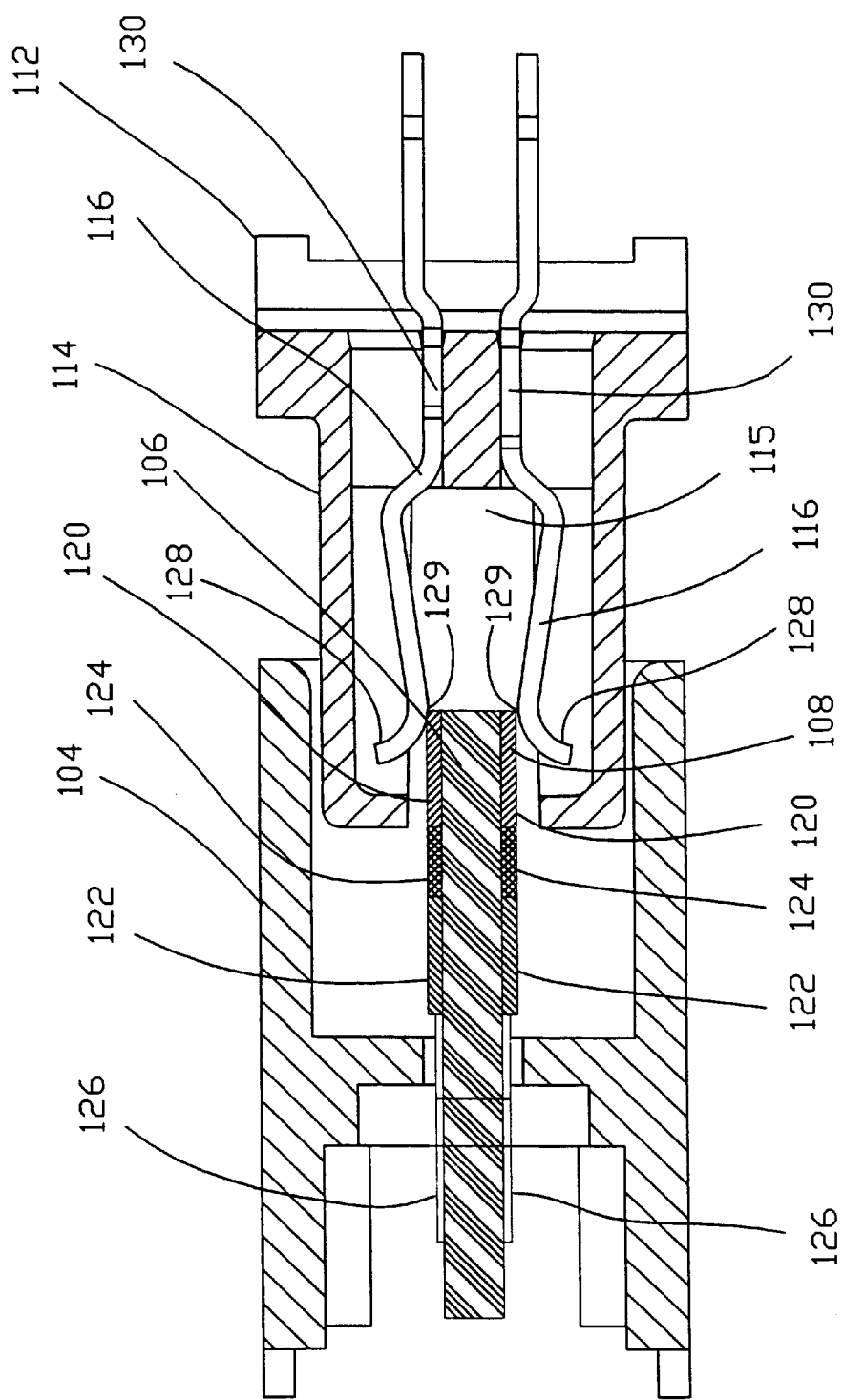
FIG. 4 is a cross sectional view of both male and female ribbon style connectors of the present invention, shown in the initial stage of interconnection.
Figure 5:
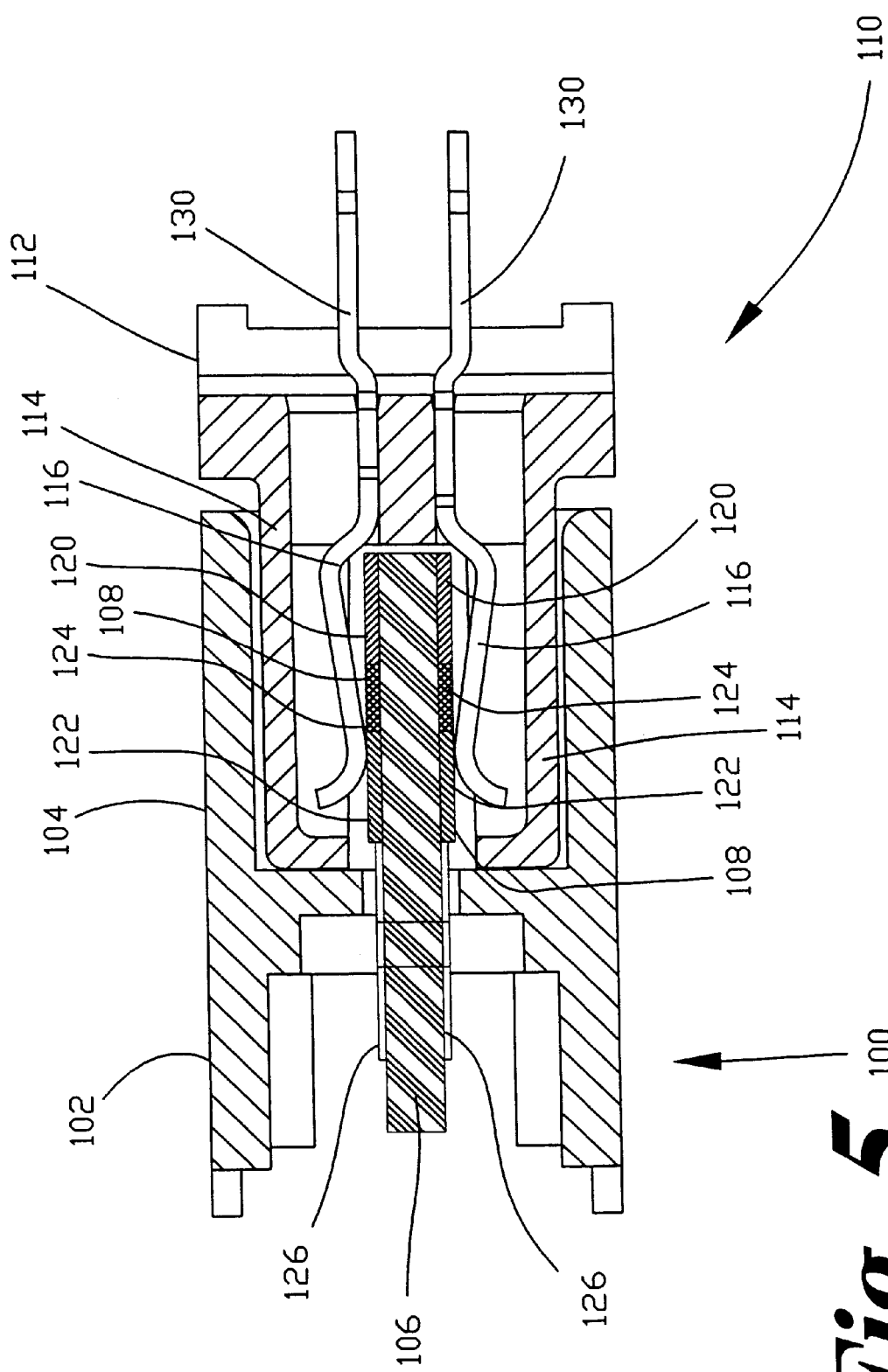
FIG. 5 is a cross sectional view of the male and female ribbon style connectors of FIG. 4, shown in a fully mated position.

A plurality of mating contacts 116 are arrayed adjacent the upper surface 117 and lower surface 119 defining contact cavity 115. The mating contacts 116 adjacent lower surface 119 are spaced apart from the contacts 116 adjacent upper surface 117, creating a narrow gap therebetween. Thus, contact cavity 115 is configured to receive leading edge 111 of substrate 106 as shown in FIGS. 4 and 5.

Figure 3:
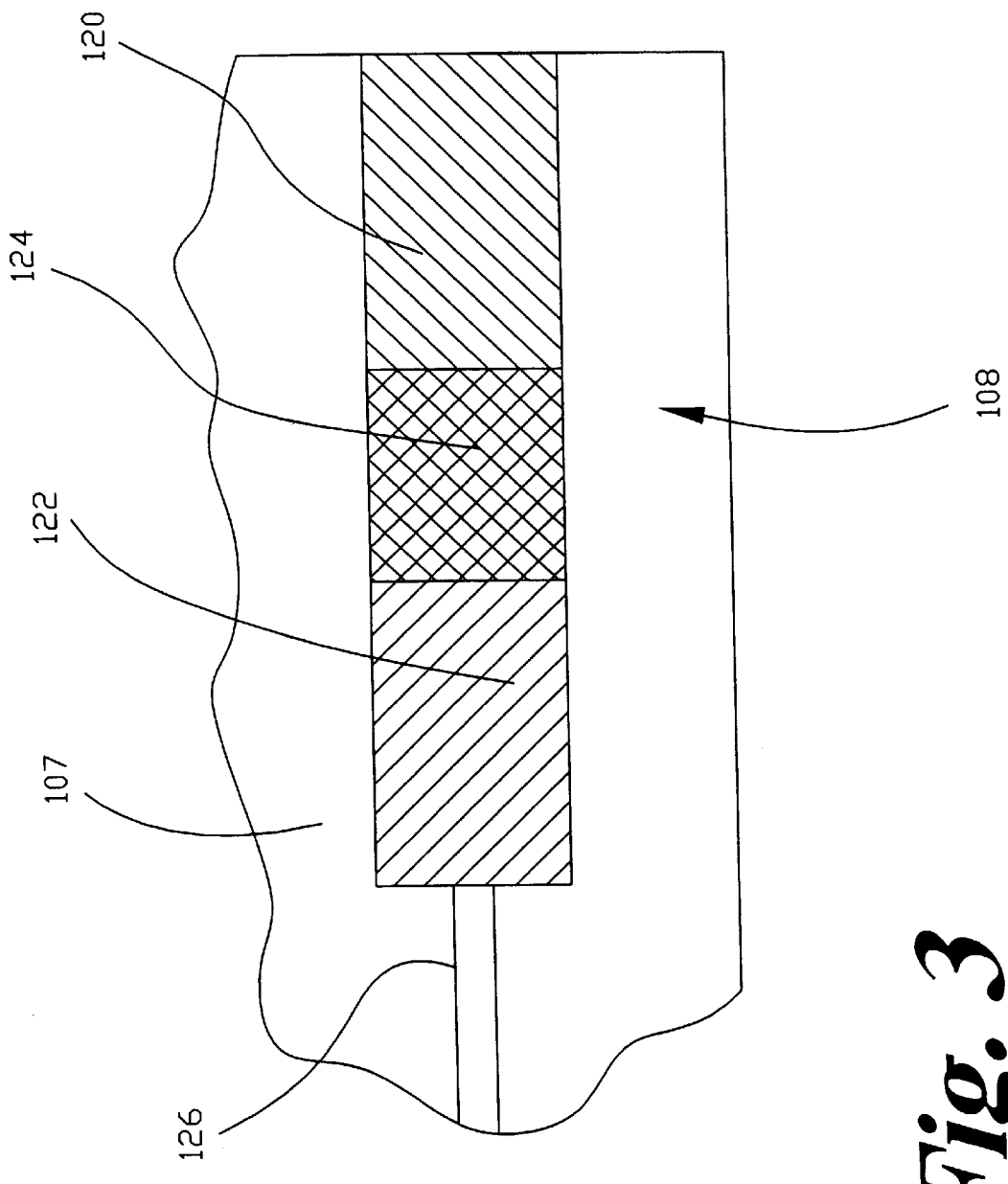
FIG. 3 is a plan view of a diminishing resistance contact printed on the surface of a printed circuit board according to the preferred embodiment of the present invention.

Turning now to FIG. 3, a diminishing resistance contact 108 according to the present invention will now be described. In many prior art ribbon style connectors the contacts 108 of the male connector are stamped metal contacts adhered to the upper and lower surfaces 107, 109 of substrate 106. More recently, conductive inks have been combined with screening techniques to screen print electrical contacts directly onto the surface of printed circuit boards. In the preferred embodiment of the present invention, conductive and resistive inks are employed in forming the diminishing resistance contact 108 shown in FIG. 3. Contact 108 includes a conductive portion or trace 122 a resistive portion or trace 120, and an overlap region 124 where resistive portion 120 overlaps conductive portion 122. Conductive portion 122 may be formed of a semi-conductive polymer overprint ink such as Goldstone™ #3100 produced by Methode Development Company of Chicago, Ill. Resistive portion 120 may be formed of a resistive polymer ink as manufactured also produced by Methode Development Company. Preferably, conductive portion 122 will be applied in a first printing operation, then resistive portion 120 will be applied in a second printing operation wherein a part of the resistive ink is printed over a small area of the pre-printed conductive portion 122, thereby creating overlap region 124. Further, a conductive trace 126 is formed on substrate 106 connecting conductive portion 122 to external circuitry either mounted elsewhere on substrate 106 or on a separate printed circuit board.

Figure 3A:
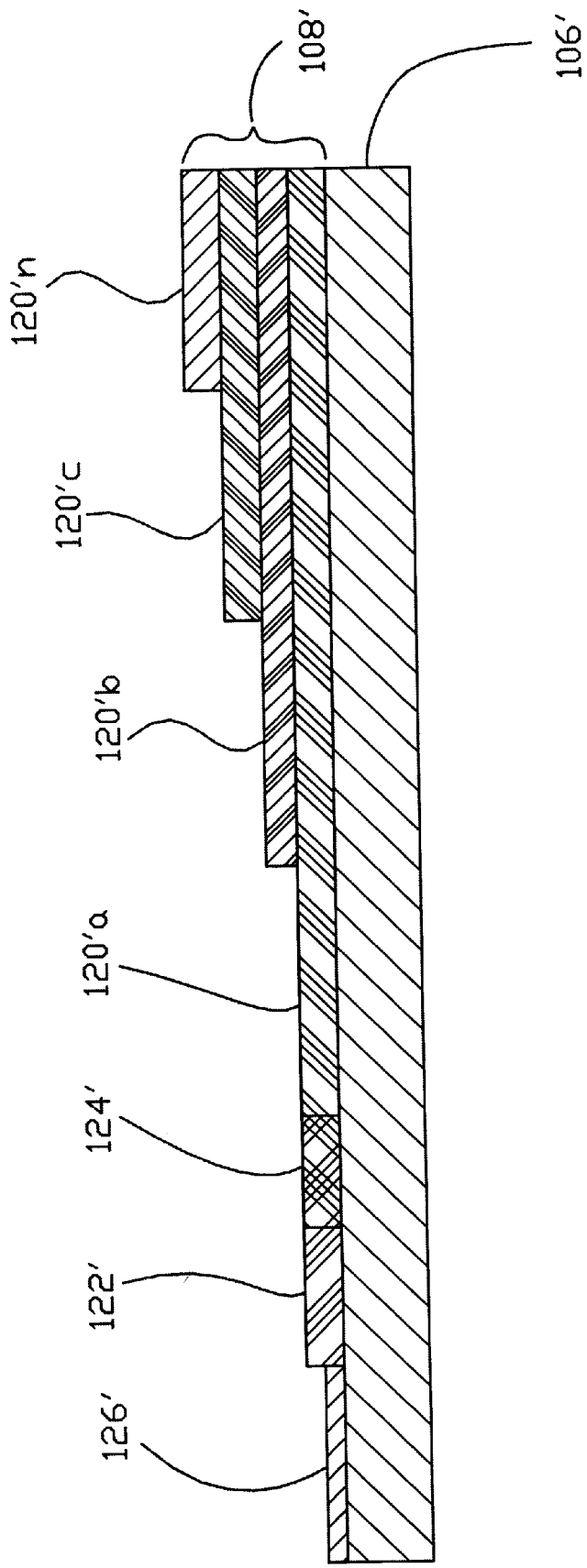
FIG. 3a is a side view of and alternate diminishing resistance contact.

An alternative diminishing resistance contact is shown in cross section in FIG. 3*a*. As with the contact previously disclosed, contact 108 of FIG. 3*a* includes a conductive portion 122' and a resistive portion. In this embodiment, however, resistive portion includes a plurality of resistive layers 120'*a*, 120'*b*, 120'*c* . . . 120'*n*, with each layer having a different resistive value. Furthermore, the resistive layers 120'*a*–120'*n* are arranged in a stair step fashion such that each layer is progressively longer than the layer immediately above. In this arrangement, the resistance between the uppermost layer 120'*n* and the conductive portion of the contact 122' will be the highest resistance, and the resistance between each successive layer and the conductive portion 122' will be reduced by a staged amount. Resistive layers 120'*a*–120'*n* are arranged such that the mating contact of the second conductor will engage the highest resistance 120'*n* first, then the step by step engaging each successive layer through 120'*a*, reducing the contact resistance with each step until finally, when the two connectors are fully mated, the mating contact of the mating connector will engage the conductive portion 122' directly, reducing the contact resistance to approximately 0 Ω.

Returning to FIGS. 1 and 2, the present invention contemplates a male ribbon style connector 100 having a plurality of contact elements 108 formed on the upper and lower surfaces 107, 109 of substrate 106. In general, each individual contact element 106 will convey a separate voltage signal between the male and female connectors 100, 110. In some applications it may be desirable to form each contact element 106 as a diminishing resistance contact as described in relation to FIG. 3 or FIG. 3*a*, or it may be desirable to have only one, or several such diminishing resistance contacts. In either case, one of ordinary skill in the art should have little difficulty in selectively locating both fully conductive contact elements and diminishing resistance contacts along the leading edge of substrate 106 according to the demands of a particular application. Furthermore, it is also possible to create a male ribbon connector 100 having exclusively conductive contact elements, while forming the diminishing resistance contacts required for the application on the female connector 110 instead.

Turning now to FIGS. 4 and 5 the operation of a connector having diminishing resistance contacts according to the present invention will now be described. Initially, a brief description of the preferred structure of the female mating contacts 116 is in order. Contacts 116 of a female ribbon connector 110 according to the preferred embodiment of the invention can be seen in the cross sectional views of FIGS. 4 and 5. Upper and lower contacts are located adjacent upper and lower surfaces 117, 119 of second contact cavity 115. Each contact comprises a curved flexible metal beam which extends from contact cavity 115 through housing 112 to the rear of the connector. In the disconnected position shown in FIG. 4, the contacts 116 are inwardly biased away from the upper and lower surfaces 117, 119 of shroud 114. The ends 128 of contacts 116 are radially flared to more readily accept substrate 106 therebetween when the male and female connectors are intermated. The point where the radial portion of the contact begins creates a contact surface 129. Contact surface 129 physically engages contact 108 on substrate 106 of male connector 100 when the two connectors are mated.

FIG. 4 shows male and female connectors 100, 110 just prior to insertion of substrate 106 into contact cavity 115. As can be seen, the distance between the contact surface 129 of the upper and lower female contact elements 116 is less than the thickness of substrate 106. Therefore, as the two connectors are mated, substrate 106 causes the various female contact elements 116 to deflect outward as the substrate is forced into contact cavity 115. Elastic forces within the contacts 116 bias the contacts against substrate 106 with a sufficient normal force to create a reliable electrical connection between female mating contacts 116 and male contacts 108 formed on substrate 106. Depending on the requirements of a particular application, one or more of the female contacts 116 may be moved forward or offset such that the signals associated with these contacts will engage a corresponding contact 108 on substrate 106 sooner than the contacts associated with other signals. Conversely, one or more of the male diminishing resistance contacts may be offset from edge 111 of substrate 106 to effect the same purpose.

As male and female connectors 100, 110 are mated, shroud 114 of female connector 110 slides into contact cavity 105 of male connector 100. Simultaneously, substrate 106 is forced into contact cavity 115 between the upper and lower sets of female contacts 116. In FIGS. 4 and 5 the thickness of the diminishing resistance contacts 108 is exaggerated to more clearly illustrate the interaction between the male and female contacts 108, 116 as the two connectors are mated. As is clear in FIG. 4, when the two connectors are initially brought together, contact surface 129 of the female contacts 116 will initially engage the diminishing resistance contacts 108 at the very end of the contacts along the edge of substrate 106. Immediately upon making contact between female and male contacts 116, 108, an electrical circuit is formed across the two connectors. However, contact surface 129 will be initially contacting the diminishing resistance contact 108 at the very end of resistive portion 120 of the contact. Therefore, a relatively large resistance will exist across the mating contacts. At this point of initial contact, the resistance across the contacts is approximately equal to the resistance per unit length of the resistive ink comprising the resistive portion multiplied by the actual length thereof. In the preferred embodiment, the ink used to form resistive portion 120 has a resistance equal to 6.66 K Ω/inch, and resistive portion is 0.075" long. Thus, in the preferred embodiment the initial resistance across the contacts will be approximately equal to 500 Ω.

As the male and female connectors 100, 110 are moved closer toward a fully mated position, the mating surface 129 of female contact 116 slides forward along the surface of resistive portion 120. As the two connectors 100, 110 move closer and closer toward a fully mated position, the amount of resistive material between the contact surface 129 of contact 116 and the conductive portion 122 of diminishing resistance contact 116 is steadily reduced. As the amount of resistive material between the contacts is continuously reduced, the actual resistance therebetween is correspondingly reduced in a continuous and linear manner as well. Finally, when the connectors are fully mated, contact surface 129 directly engages conductive portion 122 of contact 108. At this point, the resistance across the connector contacts is reduced to approximately 0 Ω.

FIG. 5 shows the two connectors 100, 110 in the fully mated position. Shroud 114 of connector 110 abuts the front surface 101 of housing 102, providing a positive indication that the connectors are fully mated. Meanwhile, substrate 106 protrudes into contact cavity 115 sufficiently to allow contact surface 129 of female contacts 116 to engage the conductive portions 122 of diminishing resistance contacts 108. Thus, when the two connectors are fully mated, the resistance across the contacts is reduced to approximately 0 Ω.

Therefore, as disclosed, a connector according to the present invention provides at least one, and possibly many, connector contacts having a progressively diminishing resistance as the connector is mated with a second, cooperating connector. As the contacts of the two connectors are initially brought together, a high resistance exists across the resistive signal contacts. As the contacts slide along one another, toward the fully mated position, the resistance across the contacts gradually diminishes until, in the fully mated position, the resistance across the contacts is approximately 0 Ω. Such a connector is well suited for hot plugging applications where it is desired to connect a peripheral device to a data communication bus without removing power from the bus. The series resistance across contacts at the initial stages of connection increases the time constant for charging the uncharged capacitance of the hot plugging peripheral device circuitry. The longer time constant helps to reduce the voltage drop on the bus signal lines during the initial moments of contact, thereby reducing the likelihood of data errors on the bus as the peripheral device is hot plugged into the bus.

It should be understood that various changes and modifications to the presently preferred embodiment described herein will be apparent to those skilled in the art. Such changes and modifications may be made without departing from the spirit and scope of the present invention and without diminishing its attendant advantages. For example, the present invention may have positive effects in connector applications other than data communications busses. In such case, the variable resistance connector contacts disclosed and claimed herein may be beneficial wherever live signals must be connected. Further, the resistive contacts of the present invention may be formed of materials other than those specifically disclosed herein. For example, the contacts could be plated, bonded or epoxied, or formed in some other manner on the surface of a substrate. Any such alternate method of forming the diminishing resistance contact should be considered as falling within the novel aspects of this invention. It is, therefore, intended that any such changes and modifications be covered by the appended claims.

What is claimed is:

1. A ribbon style electrical connector having a variable resistance contact such that an electrical resistance between the variable resistance contact and a corresponding mating contact of a second mating connector varies from a relatively high resistance to a relatively low resistance as the first and second connectors transition from an unmated to a mated position, the ribbon style connector comprising:

a housing having a first end and a second end;

a shroud depending from the first end defining a contact chamber;

a circuit board mounted within the contact chamber and communicating with the second end of the housing;

a plurality of signal contacts adhered to a surface of the circuit board, at least one of the signal contacts including a resistive portion and a conductive portion, the resistive portion and conductive portion being arranged such that the corresponding mating contact of the second connector engages the resistive portion first and engagedly moves along the resistive portion toward the conductive portion as the ribbon style connector and the second connector are intermated;

the corresponding mating contact directly engaging the conductive portion when the ribbon style connector and the second mating mating connector are in a fully mated position.

2. The ribbon style electrical connector of claim 1 wherein the resistive portion of the at least one contact comprises a film resistor screened onto a surface of the substrate, the film resistor partially overlapping the conductive portion of the at least one contact.

3. The ribbon style electrical connector of claim 1 wherein the resistive portion of the at least one contact comprises a polymer thick film resistor partially overlapping the conductive portion.

4. The ribbon style connector of claim 1 comprising a female ribbon style connector wherein the substrate is integrally formed with the shroud.

5. The ribbon style connector of claim 1 comprising a male ribbon style connector.

6. The ribbon style connector of claim 1 wherein the substrate comprises a printed circuit board partially inserted into the housing such that an edge of the printed circuit board resides within the contact chamber.

7. The ribbon style connector of claim 6 further comprising a plurality of resistive contacts formed on a surface of the printed circuit board, the resistive portion of each resistive contact being arranged along the edge of the printed circuit board and extending linearly away therefrom, the conductive portion of each resistive contact being formed co-linear with the resistive portion.

8. The ribbon style connector of claim 7 wherein the resistive portion comprises a polymer thick film resistor screened onto the printed circuit board.

9. The ribbon style connector of claim 8 wherein the conductive portions comprise a conductive ink screen printed on the surface of the substrate.

10. An electrical connector for coupling electrical signals across a detachable junction, the connector comprising:

first and second intermatable connector members;

the first connector member including a first plurality of electrical contacts and the second connector member including a corresponding second plurality of electrical contacts, the first and second plurality of contacts being arranged to form a one to one physical connection between individual contacts within the first plurality of electrical contacts and individual contacts within the second plurality of electrical contacts when the first and second connectors are placed in an intermated position; and at least one contact within one of the first plurality and second plurality including a first portion, and a second portion, and a third portion, the first portion having a relatively higher resistance per unit length than the second portion, and the second portion having a relatively higher resistance per unit length than the third portion and the first portion being formed nearest a point of engagement where a corresponding contact in the other of said first and second plurality of electrical contacts first engages the at least one contact and sequentially engages the first, second and third portions as the first and second connector members transition from an unmated to the intermated position.

11. The electrical connector of claim 10 wherein the first connector member comprises a male ribbon style connector, and the second connector member comprises a cooperating female ribbon style connector.

12. The electrical connector of claim 10 wherein the first connector member comprises a female ribbon style connector, and the second connector member comprises a cooperative male ribbon style connector.

13. The electrical connector of claim 10 further comprising a substrate, the at least one resistive contact being disposed on a surface thereof.

14. The electrical connector of claim 13 wherein the first portion of the at least one resistive contact comprises a film resistor adhered to the surface of the substrate.

15. The electrical connector of claim 14 wherein the film resistor comprises a polymer thick film resistor.

16. The electrical connector of claim 15 wherein the second portion of the at least one resistive contact comprises a gold conductive ink printed on the surface of the substrate, the polymer thick film resistor overlapping a portion of the gold contact.

17. The electrical connector of claim 16 further comprising a plurality of said resistive contacts.

18. A variable resistance contact for an electrical connector comprising:

a circuit board;

a resistive trace adhered to a surface of the circuit board, and extending generally perpendicular to an edge thereof, the resistive trace comprising a plurality of layered film resistors, each layer comprising a unique resistance; and a conductive trace adhered to the surface of the circuit board extending co-linear with the resistive trace, a portion of the resistive trace overlapping a portion of the conductive trace;

wherein a mating contact engaging the variable resistance contact will encounter a variable resistance depending on the position of the mating contact relative to the resistive trace.

19. The contact of claim 18 wherein the resistive trace comprises a film resistor.

20. The contact of claim 18 wherein the resistive trace comprises a polymer thick film resistor.

21. The contact of claim 18 wherein the resistance encountered by the mating contact varies linearly along the length of the resistive trace.

22. The contact of claim 18 wherein the resistive trace comprises a plurality of layered film resistors, each layer comprising a unique resistance and length such that the resistance encountered by the mating contact varies in pre-determined steps along the length of the resistive trace.

* * * * *